United States Patent
Vilner et al.

(10) Patent No.: US 10,705,309 B2
(45) Date of Patent: Jul. 7, 2020

(54) RF EMI REDUCING FIBER CABLE ASSEMBLY

(71) Applicant: Mellanox Technologies, Ltd., Yokneam (IL)

(72) Inventors: Pavel Vilner, Haifa (IL); Avner Badihi, Nataf (IL); Liza Nouzman, Yokneam Illit (IL); Lena Minz, Akko (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 16/423,206

(22) Filed: May 28, 2019

(65) Prior Publication Data
US 2019/0377147 A1    Dec. 12, 2019

Related U.S. Application Data

(60) Provisional application No. 62/681,131, filed on Jun. 6, 2018.

(51) Int. Cl.
| | |
|---|---|
| *G02B 6/44* | (2006.01) |
| *G02B 6/38* | (2006.01) |
| *H05K 9/00* | (2006.01) |
| *G02B 6/42* | (2006.01) |
| *H04B 10/2575* | (2013.01) |

(52) U.S. Cl.
CPC ......... *G02B 6/4471* (2013.01); *G02B 6/3817* (2013.01); *G02B 6/3878* (2013.01); *G02B 6/3893* (2013.01); *G02B 6/4277* (2013.01); *H04B 10/2575* (2013.01); *H05K 9/0083* (2013.01)

(58) Field of Classification Search
CPC .. G02B 6/4471; G02B 6/3817; G02B 6/3878; G02B 6/3893; G02B 6/4277; H04B 10/2575; H05K 9/0083
USPC .......................................................... 385/134
See application file for complete search history.

(56) References Cited

U.S. PATENT DOCUMENTS

| | | | | |
|---|---|---|---|---|
| 4,367,306 A | * | 1/1983 | Maeda ..................... | C08K 3/08 252/503 |
| 4,869,672 A | | 9/1989 | Andrews, Jr. | |

(Continued)

FOREIGN PATENT DOCUMENTS

CN      205846322 U     12/2016

OTHER PUBLICATIONS

"Cisco 40GBASE QSFP+ Modules", Data sheet, pp. 1-7, Oct. 2012.
(Continued)

*Primary Examiner* — Jerry M Blevins
(74) *Attorney, Agent, or Firm* — Kligler & Associates Patent Attorneys Ltd (57) ABSTRACT

One embodiment includes an optical connection apparatus, including an optical cable, and a fiber-attach-latch connector terminating the optical cable, and comprising a connector housing including a latch element, the connector housing being configured to be reversibly inserted into a connector receptable of an optical module having an optical transceiver, and a connector boot connected to the connector housing and disposed around a part of the optical cable, wherein at least part of the connector housing is formed from radio-frequency (RF) electromagnetic (EM) radiation absorbing material configured to absorb RF EM interference generated by the optical module.

20 Claims, 4 Drawing Sheets

(56) References Cited

U.S. PATENT DOCUMENTS

| | | | |
|---|---|---|---|
| 4,968,260 A | 11/1990 | Ingalsbe | |
| 4,993,972 A | 2/1991 | Lin | |
| 5,087,207 A | 2/1992 | Byrne | |
| 5,277,591 A | 1/1994 | Felcman et al. | |
| 5,387,110 A | 2/1995 | Kantner et al. | |
| 5,664,950 A | 9/1997 | Lawrence | |
| 5,696,669 A | 12/1997 | Bassler et al. | |
| 5,734,558 A | 3/1998 | Poplawski et al. | |
| 5,766,020 A | 6/1998 | Hughes | |
| 5,788,521 A | 8/1998 | Milan | |
| 5,984,731 A | 11/1999 | Laity | |
| 6,183,307 B1 | 2/2001 | Laity et al. | |
| 6,183,308 B1 | 2/2001 | Laity | |
| 6,203,333 B1 | 3/2001 | Medina et al. | |
| 6,215,656 B1 | 4/2001 | O'Neal et al. | |
| 6,256,448 B1 | 7/2001 | Shahid | |
| 6,517,382 B2 | 2/2003 | Flickinger et al. | |
| 6,648,695 B1 | 11/2003 | Wu | |
| 6,773,291 B1 | 8/2004 | Roth et al. | |
| 6,814,593 B2 | 11/2004 | Wang et al. | |
| 6,816,376 B2 | 11/2004 | Bright et al. | |
| 7,028,202 B2 | 4/2006 | Long et al. | |
| 7,048,550 B2 | 5/2006 | Hayland et al. | |
| 7,335,033 B1 | 2/2008 | Edwards, Jr. et al. | |
| 7,380,993 B2 | 6/2008 | Dallesasse | |
| 7,452,139 B2 | 11/2008 | Wang et al. | |
| 7,747,292 B2 | 6/2010 | Mezer et al. | |
| 7,823,041 B2 | 10/2010 | Mezer et al. | |
| 7,934,959 B2 | 5/2011 | Rephaeli et al. | |
| 8,075,199 B2 | 12/2011 | Losio et al. | |
| 8,083,417 B2 | 12/2011 | Aronson et al. | |
| 8,419,444 B2 | 4/2013 | Kagan et al. | |
| 8,599,559 B1 | 12/2013 | Morrison et al. | |
| 8,641,429 B2 | 2/2014 | Fish et al. | |
| 8,944,704 B2 | 2/2015 | Lagziel et al. | |
| D734,728 S | 7/2015 | Lagziel et al. | |
| 9,793,667 B1 | 10/2017 | Park et al. | |
| 9,887,782 B2 | 2/2018 | Hosking | |
| 10,122,106 B2 | 11/2018 | Regnier | |
| 10,128,627 B1 | 11/2018 | Kazav et al. | |
| 10,276,995 B2 | 4/2019 | Little | |
| 2001/0019907 A1 | 9/2001 | Glad et al. | |
| 2004/0013369 A1 | 1/2004 | Coffey et al. | |
| 2004/0023559 A1 | 2/2004 | Wu | |
| 2005/0254759 A1* | 11/2005 | O'Brien | G02B 6/4202 385/92 |
| 2007/0232132 A1 | 10/2007 | Ling et al. | |
| 2007/0237464 A1 | 10/2007 | Aronson et al. | |
| 2007/0237472 A1 | 10/2007 | Aronson et al. | |
| 2008/0044141 A1 | 2/2008 | Willis et al. | |
| 2008/0069052 A1 | 3/2008 | Mezer et al. | |
| 2008/0150546 A1 | 6/2008 | Gale | |
| 2008/0249470 A1 | 10/2008 | Malave et al. | |
| 2008/0267620 A1 | 10/2008 | Cole et al. | |
| 2009/0060425 A1 | 3/2009 | Aronson et al. | |
| 2009/0061662 A1 | 3/2009 | Chin | |
| 2009/0093137 A1 | 4/2009 | Badehi et al. | |
| 2009/0093166 A1 | 4/2009 | Fogg et al. | |
| 2009/0232151 A1 | 9/2009 | Furlong et al. | |
| 2009/0247006 A1 | 10/2009 | Thompson | |
| 2010/0014566 A1 | 1/2010 | Mezer et al. | |
| 2011/0123157 A1 | 5/2011 | Belsan et al. | |
| 2012/0015552 A1 | 1/2012 | Diab et al. | |
| 2012/0141132 A1 | 6/2012 | Walker | |
| 2012/0264335 A1 | 10/2012 | Feyder et al. | |
| 2013/0071072 A1* | 3/2013 | Xie | G02B 6/4277 385/92 |
| 2013/0251052 A1 | 9/2013 | Tang et al. | |
| 2015/0092363 A1 | 4/2015 | Blier et al. | |
| 2015/0147062 A1 | 5/2015 | Otte | |
| 2015/0282382 A1 | 10/2015 | Nguyen | |
| 2016/0006182 A1 | 1/2016 | Patel | |
| 2017/0005446 A1 | 1/2017 | Regnier | |
| 2017/0077643 A1* | 3/2017 | Zbinden | G02B 6/4268 |
| 2018/0259723 A1 | 9/2018 | Mentovich et al. | |
| 2019/0044299 A1 | 2/2019 | Kazav et al. | |

OTHER PUBLICATIONS

International Electrotechnical Commission, Standard IEC-61754-7, "Fibre optic interconnecting devices and passive components—Fibre optic connector interfaces—Part 7: Type MPO connector family", Edition 3.0, pp. 1-32, Mar. 2008.

International Electrotechnical Commission, Standard IEC-61754-5, "Fibre optic connector interfaces Part 5: Type MT connector family", Edition 2.0, pp. 1-32, Jul. 2005.

Mellanox Technologies, "Quad to Serial Small Form Factor Pluggable Adapter: Enabling VPI/40GigE Connectivity on 1/10GigE Infrastructure", 1 page, USA 2010.

SFF Committee, "SFF-8431 Specifications for Enhanced Small Form Factor Pluggable Module SFP+", Revision 4.1, pp. 1-132, Jul. 6, 2009.

SFF Committee, "SFF-8436 Specification for QSFP+ Copper and Optical Modules", Revision 3.4, pp. 1-71, Nov. 12, 2009.

SFF Committee, "INF-8438i Specification for QSFP (Quad Small Formfactor Pluggable) Transceiver", Revision 1.0, pp. 1-75, Nov. 2006.

Barrass et al, "10GBASE-T: 10 Gigabit Ethernet over Twisted-pair Copper", Ethernet Alliance, Version 1.0, Austin, USA, pp. 1-44, Aug. 2007.

Aquantia Corporation, Quad 10GBASE-T Product Brief, Version 1.0, Milpitas, USA, pp. 1-2, Apr. 23, 2009.

IEEE Standard 802.3an-2006, "IEEE Standard for Information technology—Telecommunications and information exchange between systems—Local and metropolitan area networks—Specific requirements; Part 3: Carrier Sense Multiple Access with Collision Detection (CSMA/CD) Access Method and Physical Layer Specifications; Amendment 1: Physical Layer and Management Parameters for 10 Gb/s Operation, Type 10GBASE-T", pp. 1-181, Sep. 1, 2006.

Solarflare Communications, Inc., Solarflare SFN5122F Dual-Port 10G Ethernet Enterprise Server Adapter, Product Brief, pp. 1-2, year 2011.

Teranetics—PLX Technology, Inc., "Dual-Speed 10GBase-T / 1000 Base-T Ethernet Physical Layer Device", Product Brief, pp. 1-3, year 2010.

SFP-DD MSA, "SFP-DD Hardware Specification for SFP Double Density 2X Pluggable Transceiver", Revision 1.1, pp. 1-49, Jan. 7, 2018.

Cisco, "Cisco QSFP to SFP or SFP+ Adapter Module", pp. 1-3, Jun. 24, 2017.

Mellanox Technologies, "10Gb/s DynamiX QSATM QSFP+ to SFP+ Adapter", pp. 1-3, Feb. 8, 2018.

QSFP-DD MSA, "QSFP-DD Hardware Specification for QSFP Double Density 8X Pluggable Transceiver", Revision 3.0, pp. 1-69, Sep. 19, 2017.

OSFP "Frequently Asked Questions", pp. 1-2, May 15, 2017.

Khamaisee et al., U.S. Appl. No. 16/044,520, filed Jul. 25, 2018.

Gera et al. U.S. Appl. No. 16/355,753, filed Mar. 17, 2019.

ARC Technologies, Inc., "DD Series", 1 page, year 2017.

U.S. Appl. No. 16/355,753 office action dated Jan. 31, 2020.

\* cited by examiner

RF EMI REDUCING FIBER CABLE ASSEMBLY

RELATED APPLICATION INFORMATION

The present application claims priority from U.S. Provisional Patent Application Ser. No. 62/681,131 of Vilner, et al., filed Jun. 6, 2018, the disclosure of which is hereby incorporated herein by reference.

FIELD OF THE INVENTION

The present invention relates to data communication cables, and in particular, but not exclusively to, fiber optic cables.

BACKGROUND

Some optical modules may include optical transceivers and generate radio-frequency (RF) Electromagnetic Interference (EMI). For example, a 25.78 Gbps small form-factor pluggable (SFP) optical module may generate RF EMI at 25.78 GHz as an inherent part of its normal operation and radiate the RF EMI from a fiber-attach-latch connector of an optical cable attached to the optical module.

The RF EMI generally escapes the module via various gaps between the module and the fiber-attach-latch-connector. The geometry of the module is defined by the module specification to ensure interoperability between different vendors and, as such, cannot be changed by the module manufacturer to improve the electromagnetic compatibility (EMC).

SUMMARY

There is provided in accordance with an embodiment of the present disclosure, an optical connection apparatus, including an optical cable, and a fiber-attach-latch connector terminating the optical cable, and including a connector housing including a latch element, the connector housing being configured to be reversibly inserted into a connector receptable of an optical module having an optical transceiver, and a connector boot connected to the connector housing and disposed around a part of the optical cable, wherein at least part of the connector housing is formed from radio-frequency (RF) electromagnetic (EM) radiation absorbing material configured to absorb RF EM interference generated by the optical module.

Further in accordance with an embodiment of the present disclosure the RF EM radiation absorbing material has at least one of a relative permittivity loss coefficient greater than 0.25, and a relative permeability loss coefficient greater than 0.25 at a frequency of the RF EM interference generated by the optical module.

Still further in accordance with an embodiment of the present disclosure at least 5 mm3 of the connector housing is formed from the RF EM radiation absorbing material.

Additionally, in accordance with an embodiment of the present disclosure at least 1 mm3 of the connector housing is formed from the RF EM radiation absorbing material.

Moreover, in accordance with an embodiment of the present disclosure the RF EM radiation absorbing material forming at least 1 mm3 of the connector housing includes a plastic or elastomeric material mixed with an RF EM absorber.

Further in accordance with an embodiment of the present disclosure the RF EM absorber is selected from carbonyl iron or carbon powder.

Still further in accordance with an embodiment of the present disclosure the fiber-attach-latch connector includes an RF EM radiation absorbing sleeve disposed at least partially over the connector boot, and including RF EM radiation absorbing material.

Additionally, in accordance with an embodiment of the present disclosure the RF EM radiation absorbing material of the RF EM radiation absorbing sleeve includes a plastic or an elastomeric material mixed with an RF EM absorber.

Moreover, in accordance with an embodiment of the present disclosure the RF EM absorber is selected from carbonyl iron or carbon powder.

Further in accordance with an embodiment of the present disclosure the RF EM radiation absorbing sleeve is disposed at least partially over the connector boot and at least partially over the connector housing.

Still further in accordance with an embodiment of the present disclosure the RF EM radiation absorbing sleeve includes a flexible region, which covers the latch element, so as to enable actuation of the latch element via depressing the flexible region of the RF EM radiation absorbing sleeve.

There is also provided in accordance with another embodiment of the present disclosure, an optical connection apparatus, including an optical cable, and a fiber-attach-latch connector terminating the optical cable, and including a connector housing including a latch element, the connector housing being configured to be reversibly inserted into a connector receptable of an optical module having an optical transceiver, a connector boot connected to the connector housing and disposed around a part of the optical cable, and a radio-frequency (RF) electromagnetic (EM) radiation absorbing sleeve disposed at least partially over the connector boot, and including RF EM radiation absorbing material configured to absorb RF EM interference generated by the optical module.

Additionally, in accordance with an embodiment of the present disclosure the RF EM radiation absorbing material has at least one of a relative permittivity loss coefficient greater than 0.25, and a relative permeability loss coefficient greater than 0.25 at a frequency of the RF EM interference generated by the optical module.

Moreover, in accordance with an embodiment of the present disclosure the RF EM radiation absorbing material of the RF EM radiation absorbing sleeve includes a plastic or an elastomeric material mixed with an RF EM absorber.

Further in accordance with an embodiment of the present disclosure the RF EM absorber is selected from carbonyl iron or carbon powder.

Still further in accordance with an embodiment of the present disclosure the RF EM radiation absorbing sleeve is disposed at least partially over the connector boot and at least partially over the connector housing.

Additionally, in accordance with an embodiment of the present disclosure the RF EM radiation absorbing sleeve includes a flexible region, which covers the latch element, so as to enable actuation of the latch element via depressing the flexible region of the RF EM radiation absorbing sleeve.

Moreover, in accordance with an embodiment of the present disclosure at least part of the connector housing is formed from RF EM radiation absorbing material.

Further in accordance with an embodiment of the present disclosure at least 1mm3 of the connector housing is formed from RF EM radiation absorbing material.

Still further in accordance with an embodiment of the present disclosure the RF EM radiation absorbing material forming at least 1 mm3 of the connector housing includes a plastic or elastomeric material mixed with an RF EM absorber.

Additionally, in accordance with an embodiment of the present disclosure the RF EM absorber is selected from carbonyl iron or carbon powder.

BRIEF DESCRIPTION OF THE DRAWINGS

The present invention will be understood from the following detailed description, taken in conjunction with the drawings in which.

DESCRIPTION OF EXAMPLE EMBODIMENTS

Overview

As mentioned above, optical modules with optical transceivers may generate radio-frequency (RF) Electromagnetic Interference (EMI). For example, a 25.78 Gbps small form-factor pluggable (SFP) may generate RF EMI at 25.78 GHz as an inherent part of its normal operation and radiate the RF EMI from a fiber-attach-latch connector of an optical cable attached to the optical module. The RF EMI generally escapes the module via various gaps between the optical module and the fiber-attach-latch-connector.

The inventors have identified this RF EMI problem in optical modules produced by various manufacturers and in many cases the level of EMI causes non-compliance with specified EMI levels.

Compounding the problem is that the geometry of the optical module is defined by the module specification to ensure interoperability between different vendors and, as such, cannot be changed by the module manufacturer to improve the electromagnetic compatibility (EMC).

Embodiments of the present invention significantly reduce the RF EMI by strategically placing RF electromagnetic (EM) radiation absorbing material in a fiber-attach-latch connector to absorb the RF EMI close to its source while complying with the module specification to ensure interoperability between different vendors.

In some embodiments, the fiber-attach-latch connector includes a connector housing which is reversibly inserted into a connector receptable of an optical module. The connector housing is at least partially formed from an RF EM radiation absorbing material in order to absorb the RM EMI close to its source. The connector housing generally has the same geometry as the connector housing of non-RF EM radiation absorbing connector housings thereby still complying with the module specification to ensure interoperability between different vendors.

The connector housing may include a front portion which is inserted into the connector receptacle of the optical module, a rear portion which remains outside of the connector receptable of the optical module, and a latch element which allows securing the connector housing to, and removing the connector housing from, the connector receptacle of the optical module. In some embodiments, the front portion, the rear portion, and the latch element may be formed as a single unit or from separate parts, from the RF EM radiation absorbing material. In other embodiments, some of the elements of the connector housing are formed from the RF EM radiation absorbing material, while other elements of the connector housing are formed from a non-RF EM radiation absorbing material, such as plastic or rubber.

The term "RF EM radiation absorbing material", as used in the specification and claims, is defined herein as a material having: a relative permittivity loss coefficient greater than 0.25; and/or a relative permeability loss coefficient (tan(δ)) greater than 0.25 at the frequency of the RF EMI generated by the optical module.

Any suitable RF EM radiation absorbing material, as defined above, may be used which provides sufficient RF EM radiation absorption qualities according to the amount, and frequency, of RF EMI being generated by the optical module. For example, the RF EM radiation absorbing material used in the connector housing may comprise a plastic or elastomeric material mixed with an RF EM absorber, such as carbonyl iron, carbon powder, or ARC DD series produced by ARC Technologies of 37 S. Hunt Rd, Amesbury, Mass. 01913, USA.

In other embodiments, an RF EM radiation absorbing sleeve is disposed at least partially over a connector boot or boots of the fiber-attach-latch connector and/or at least partially over the rear portion of the connector housing. The sleeve may extend back from the connector boot(s) over part of an optical cable which is terminated by the fiber-attach-latch connector. One advantage of these other embodiments is that the RF EM radiation absorbing sleeve may be installed over an off-the-shelf fiber-attach-latch connector thereby transforming a previously non-RF EM absorbing fiber-attach-latch connector into an RF EM absorbing fiber-attach-latch connector. Additionally, the sleeve does not extend to the region where the connector housing inserts into the optical module so that the fiber-attach-latch connector still complies with the module specification to ensure interoperability between different vendors.

The RF EM radiation absorbing sleeve may also partially cover the latch element. Therefore, the sleeve is generally flexible, at least in the region of the latch element, to enable actuation of the latch element via depressing the sleeve in that region.

Any suitable RF EM radiation absorbing material, as defined above, may be used which provides sufficient RF EM radiation absorption qualities according to the amount, and frequency, of RF EMI being generated by the optical module as well as providing flexibility, at least in the region of the latch element. For example, the RF EM radiation absorbing material used in the sleeve may comprise a plastic and/or elastomeric material mixed with an RF EM absorber, such as carbonyl iron, carbon powder, or ARC DD series mentioned above.

In some embodiments, the fiber-attach-latch connector may include: the RF EM radiation absorbing sleeve covering at least part of the connector boot(s) and/or the rear portion of the connector housing; and at least part of the connector housing being formed from RF EM radiation absorbing material thereby combining the two embodiments described above.

System Description

Documents incorporated by reference herein are to be considered an integral part of the application except that, to the extent that any terms are defined in these incorporated documents in a manner that conflicts with definitions made explicitly or implicitly in the present specification, only the definitions in the present specification should be considered.

Figure 1:
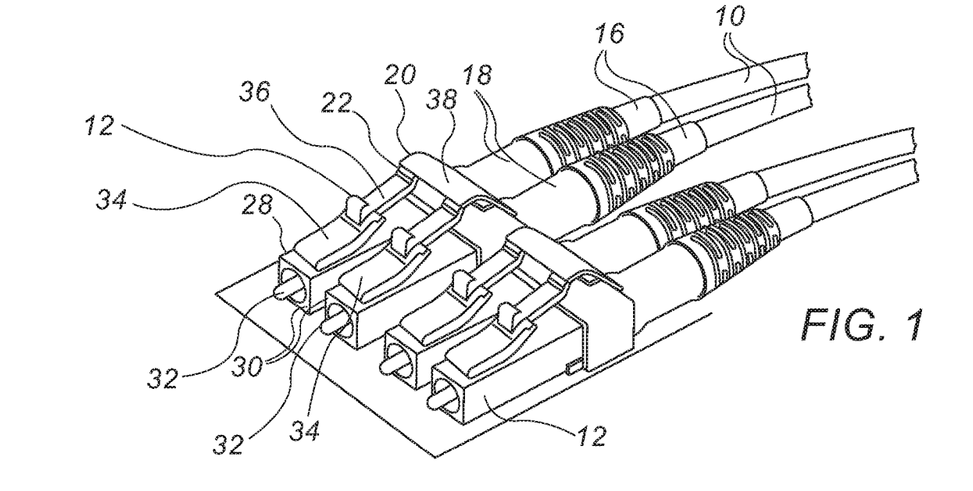
FIG. 1 is a schematic view of an optical cable terminated with fiber-attach-latch connectors.
Figure 2:
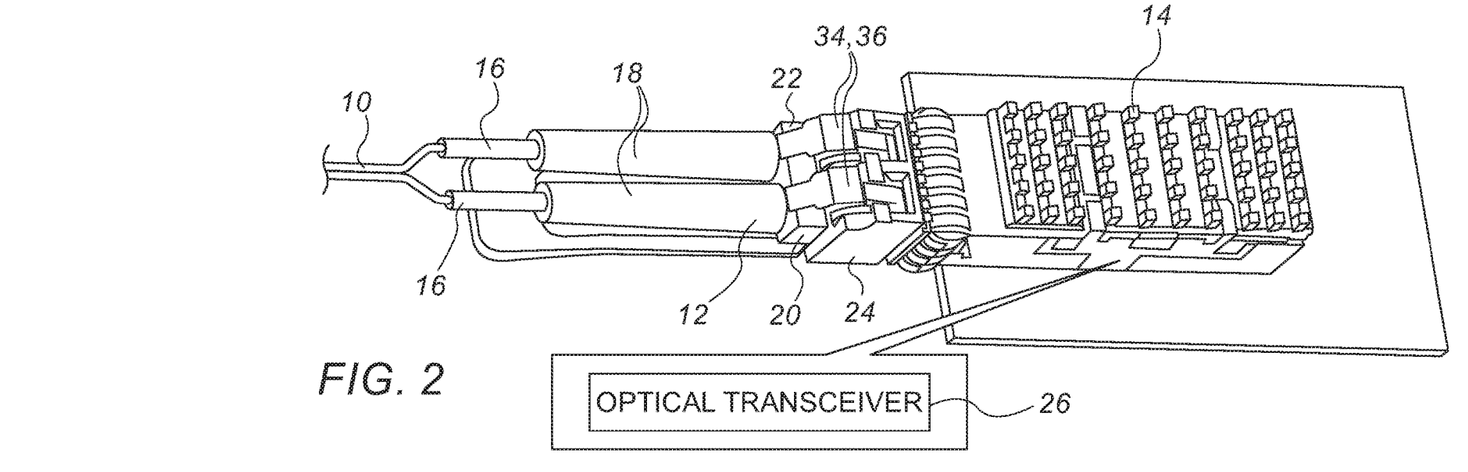
FIG. 2 is a schematic view of a fiber-attach-latch connector inserted into an optical module.

Reference is now made to FIGS. 1 and 2. FIG. 1 is a schematic view of an optical cable 10 terminated with fiber-attach-latch connectors 12. FIG. 2 is a schematic view of one of the fiber-attach-latch connectors 12 inserted into an optical module 14. The optical module includes an optical transceiver 26 for converting between optical and electrical signals. The fiber-attach-latch connectors 12 are non-RF EM absorbing and may be formed from any suitable material, for example, but not limited to, plastic, rubber or other elastomeric material. For the sake of simplicity, the various elements of the fiber-attach-latch connectors 12 shown in FIG. 1 are only labeled for one of the fiber-attach-latch connectors 12 in FIG. 1.

The optical cable 10 divides into two sections 16 before entering the fiber-attach-latch connectors 12 via connector boots 18 of the fiber-attach-latch connectors 12. In the example of FIGS. 1 and 2, each fiber-attach-latch connector 12 includes two connector boots 18, one on either side of each fiber-attach-latch connector 12. The connector boots 18 are connected to a rear portion 20 of a connector housing 22 of the fiber-attach-latch connector 12. The connector boots 18 are disposed around a part of the optical cable 10 and prevent excessive bending of the optical cable 10. In some embodiments, each fiber-attach-latch connector 12 may include a single connector boot 18.

The connector housing 22 also includes a front portion 28 which inserts into a connector receptacle 24 of the optical module 14. The front portion 28 is divided into two sections 30. Each of the sections 30 has an alignment pin 32 for correct alignment of the sections 30 within the connector receptacle 24.

The connector housing 22 also includes a latch element 34 for securing the front portion 28 of the connector housing 22 in the connector receptacle 24, and for releasing the front portion 28 from the connector receptacle 24. An elongated deflectable portion 36 of the latch element 34 is connected to each section 30 of the front portion 28 for securing that section 30 in the connector receptacle 24. A deflectable portion 38 of the latch element 34 is connected across the rear portion 20 of the connector housing 22 and over one end of the elongated deflectable portions 36 so that depressing the deflectable portion 38 depresses the elongated deflectable portions 36 allowing release of the front portion 28 from the connector receptacle 24.

Figure 6:
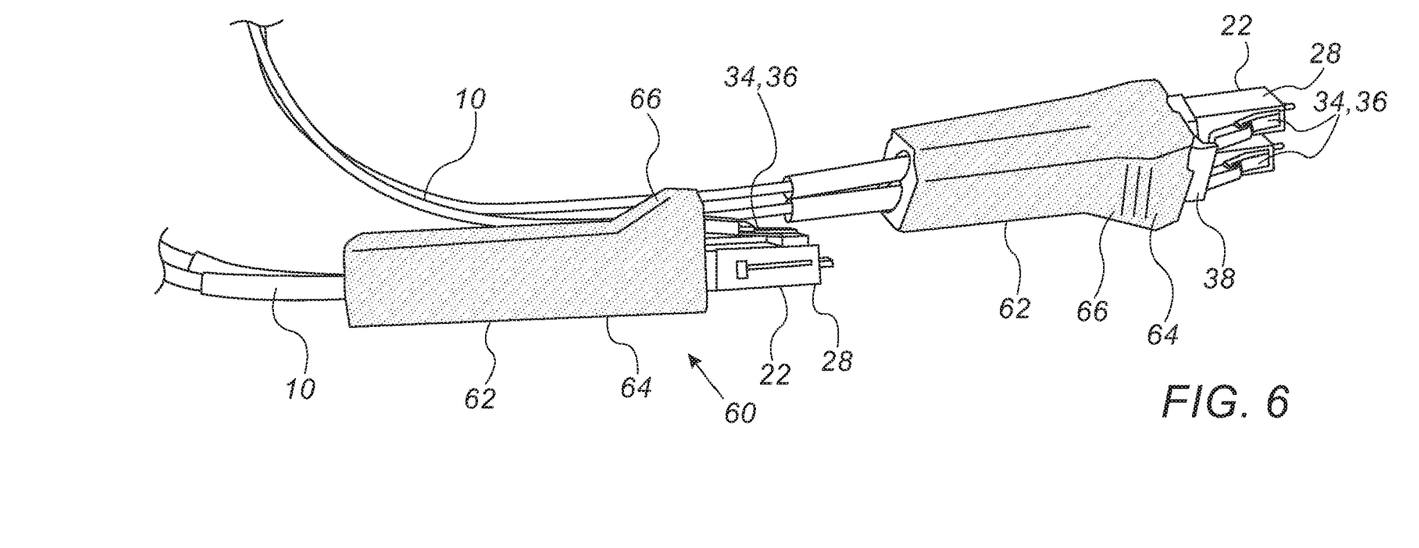
FIG. 6 is a schematic three-dimensional view of the optical connection apparatus of FIG. 5.

For the sake of simplicity, the deflectable portion 38 is not shown in the figures other than in FIGS. 1 and 6. However, the deflectable portion 38, or a similar element, may be included in any of the embodiments described below to allow depressing of the elongated deflectable portions 36, or similar elements.

Figure 3:
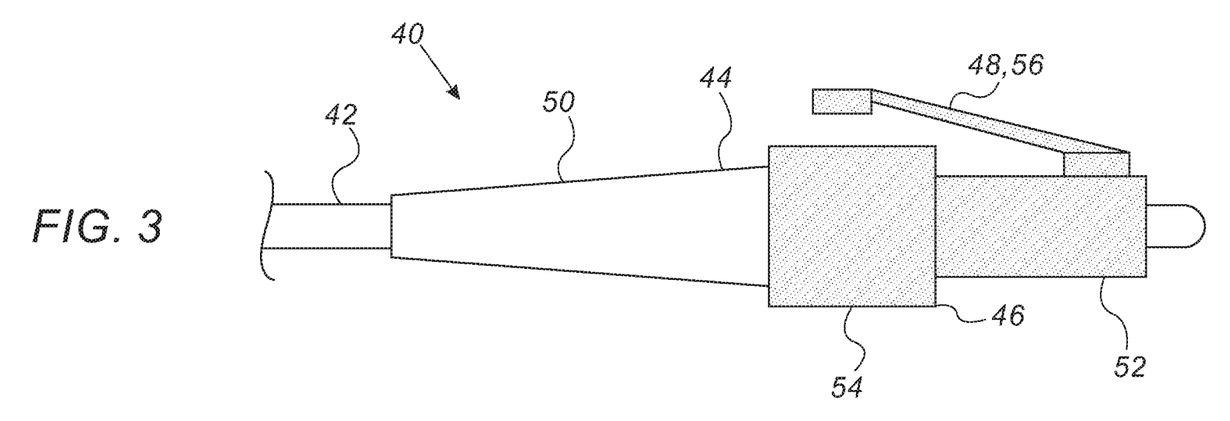
FIG. 3 is a schematic cross-sectional view of a radio-frequency (RF) electromagnetic (EM) radiation absorbing optical connection apparatus constructed and operative in accordance with an embodiment of the present invention.
Figure 4:
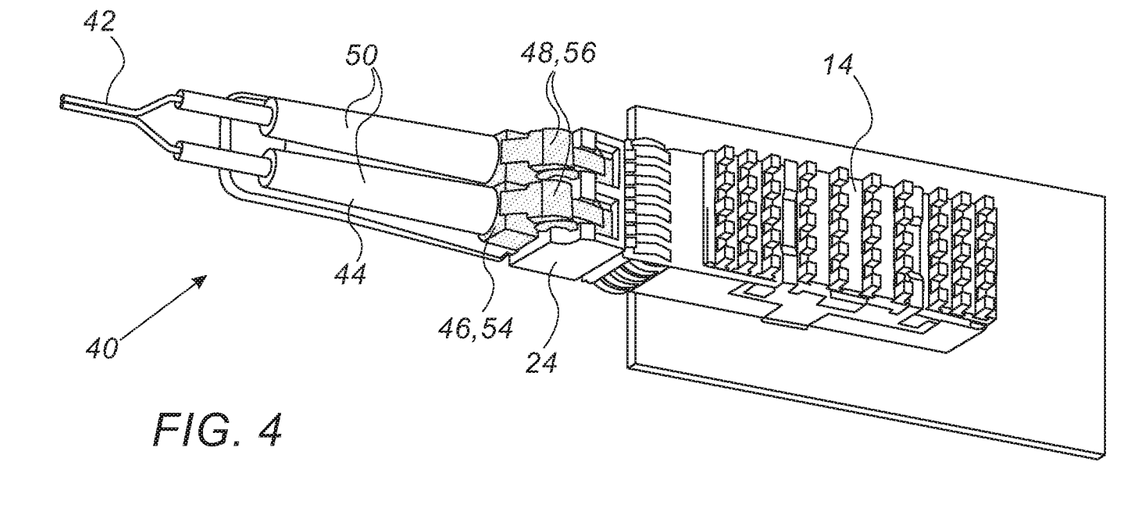
FIG. 4 is a schematic view of the optical connection apparatus of FIG. 3 inserted into an optical module.

Reference is now made to FIGS. 3 and 4. FIG. 3 is a schematic cross-sectional view of a radio-frequency (RF) electromagnetic (EM) radiation absorbing optical connection apparatus 40 constructed and operative in accordance with an embodiment of the present invention. FIG. 4 is a schematic view of the optical connection apparatus 40 of FIG. 3 inserted into the optical module 14.

The RF EM radiation absorbing optical connection apparatus 40 includes an optical cable 42 and a fiber-attach-latch connector 44 terminating the optical cable 42 at each end of the optical cable 42. The fiber-attach-latch connector 44 is substantially the same as the fiber-attach-latch connector 12 of FIGS. 1 and 2 except for the differences described below.

The fiber-attach-latch connector 44 includes a connector housing 46 including a latch element 48. The connector housing 46 is configured to be reversibly inserted into the connector receptacle 24 of the optical module 14.

The fiber-attach-latch connector 44 includes two connector boots 50 connected to the connector housing 46 and disposed around a part of the optical cable 42. The connector boots 50 prevent excessive bending of the optical cable 42. In some embodiments, the fiber-attach-latch connector 44 includes a single connector boot 50 disposed around part of the optical cable 42.

The connector housing 46 includes a front portion 52 and a rear portion 54. The front portion 52 is generally inserted into the connector receptacle 24 of the optical module 14 while the rear portion 54 remains external to the connector receptacle 24. The latch element 48 includes two elongated deflectable portions 56. Respective ones of the elongated deflectable portions 56 are connected to respective sections of the front portion 52. The connector housing 46 is substantially the same as the connector housing 22 of FIGS. 1 and 2 with regard to geometry, dimensions, and latching functionality. Therefore, the connector housing generally has the same geometry as the connector housing of non-RF EM radiation absorbing connector housings thereby still complying with the module specification to ensure interoperability between different vendors. However, the connector housing 46 differs from the connector housing 22 with regard to the materials used to form sections of the connector housing 46 as will now be described in more detail below.

FIGS. 3 and 4 show that the connector housing 46 including the front portion 52, the rear portion 54 and the latch element 48 are formed from RF EM radiation absorbing material. In some embodiments, the front portion 52, the rear portion 54 and the latch element 48 are formed as a unitary item molded from the RF EM radiation absorbing material. In other embodiments, each section of the front portion 52 (corresponding to sections 30 of FIG. 1) is formed as a separate unitary item with the associated part of the latch element 48, while the rear portion 54 is formed as another unitary item.

In some embodiments, only part of the connector housing 46 is formed from RF EM radiation absorbing material. For example, the front portion 52 and the latch element 48 may be molded from RF EM radiation absorbing material as one or two unitary items while the rear portion 54 may be formed from a non-RF EM radiation absorbing material such as rubber or plastic. The connector housing 46 may be formed from any suitable combination of RF EM radiation absorbing and non-RF EM radiation absorbing sections.

In some embodiments at least 1 mm$^3$ of the connector housing 46 is formed from RF EM radiation absorbing material, while in other embodiments at least 5 mm³ of the connector housing 46 is formed from RF EM radiation absorbing material.

The RF EM radiation absorbing material used in at least part of the connector housing 46 is configured to absorb RF EM interference generated by the optical module 14. The RF EM radiation absorbing material may be any suitable RF EM radiation absorbing material, as defined herein, according to the amount, and frequency, of RF EMI being generated by the optical module 14. The term "RF EM radiation absorbing material", as used in the specification and claims, is defined herein as a material having: a relative permittivity loss coefficient greater than 0.25; and/or a relative permeability loss coefficient (tan(δ)) greater than 0.25 at the frequency of the RF EMI generated by the optical module 14. For the sake of clarity, the definition of an RF EM radiation absorbing material includes any of the following: a material having a relative permittivity loss coefficient less than or equal to 0.25 and a relative permeability loss coefficient greater than 0.25 at the frequency of the RF EMI generated by the optical module 14; a material having a relative permittivity loss coefficient greater than 0.25 and a relative permeability loss coefficient less than or equal to 0.25 at the frequency of the RF EMI generated by the optical module 14; and a material having a relative permittivity loss coefficient greater than 0.25 and a relative permeability loss coefficient greater than 0.25 at the frequency of the RF EMI generated by the optical module 14.

The RF EM radiation absorbing material forming at least part of the connector housing 46 may comprise a plastic and/or elastomeric material mixed with an RF EM absorber, such as carbonyl iron, carbon powder, or ARC DD series. In some embodiments the RF EM absorber may comprise more than 50%, and typically 70%, of the RF EM radiation absorbing material mixture by mass. For example, RF EM radiation absorbing material may include 30-50% of a plastic and/or an elastomeric material mixed with 50-70% of the RF EM absorber, such as carbonyl iron, carbon powder, or ARC DD series, by mass.

Figure 5:
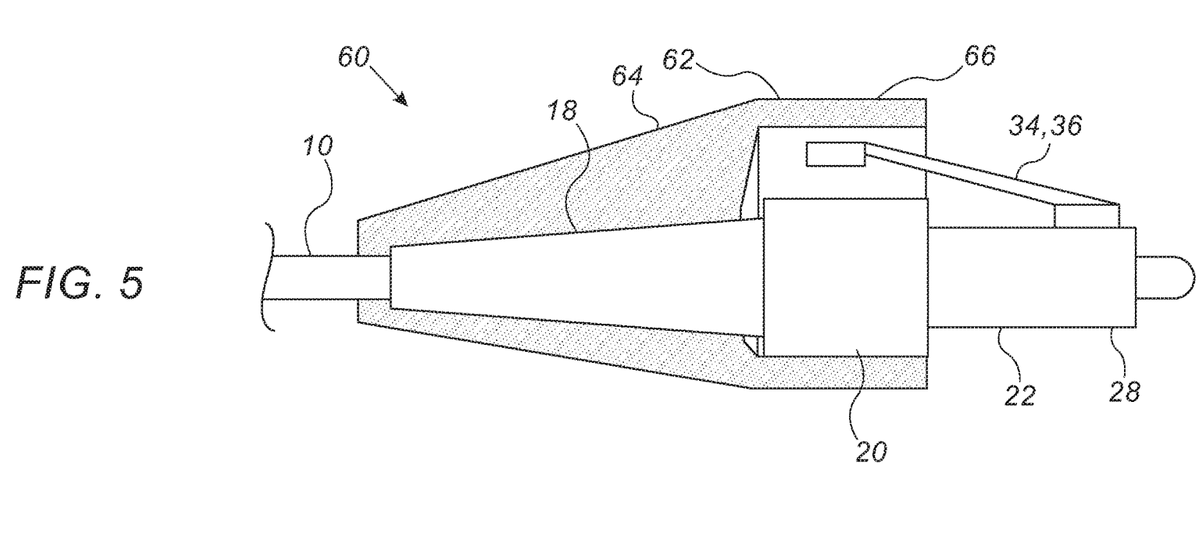
FIG. 5 is a schematic cross-sectional view of a radio-frequency (RF) electromagnetic (EM) radiation absorbing optical connection apparatus constructed and operative in accordance with a first alternative embodiment of the present invention.
Figures 7, 8:
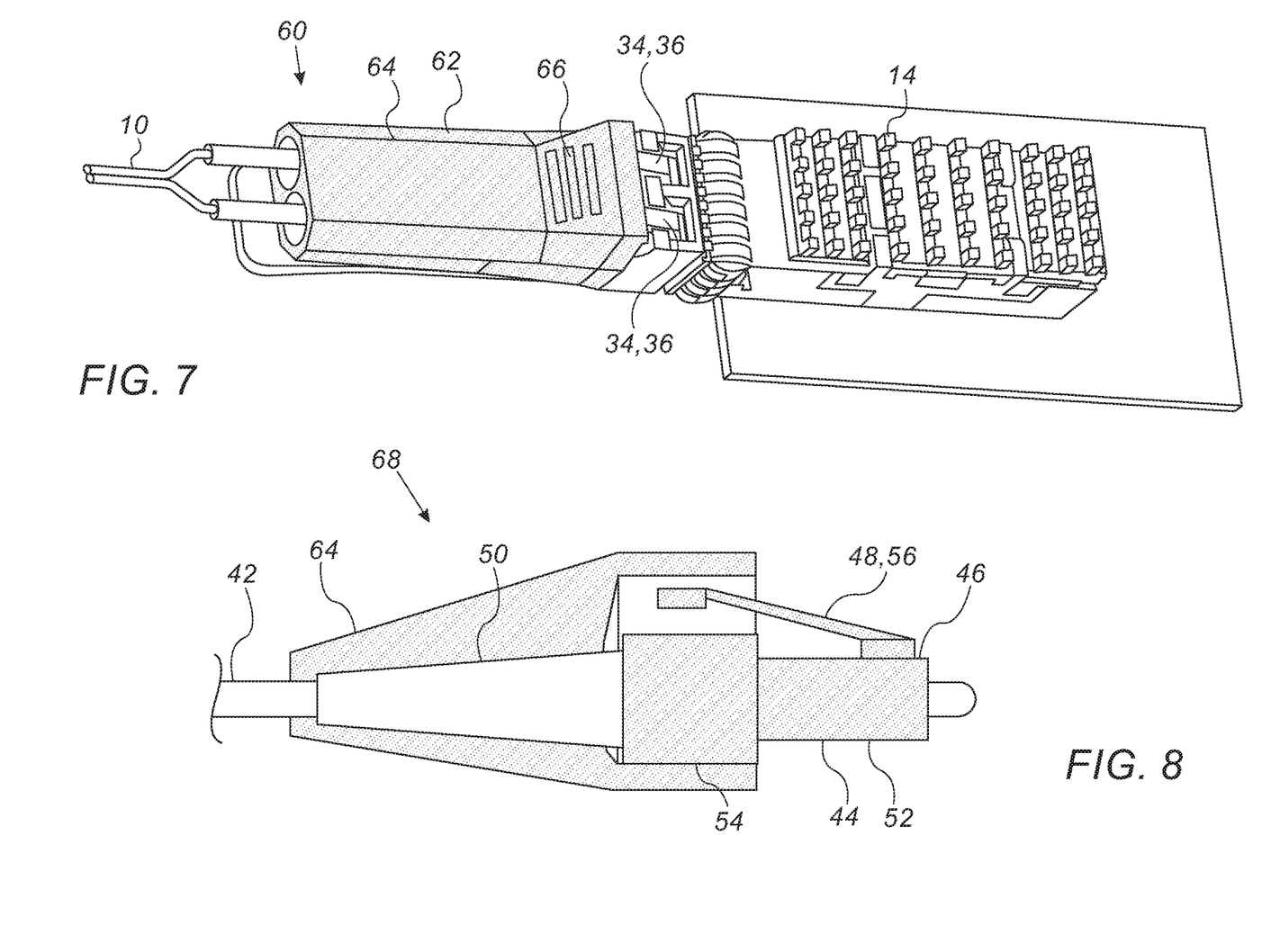
FIG. 7 is a schematic view of the optical connection apparatus of FIG. 5 inserted into an optical module.
FIG. 8 is schematic cross-sectional view of a radio-frequency (RF) electromagnetic (EM) radiation absorbing optical connection apparatus constructed and operative in accordance with a second alternative embodiment of the present invention.

Reference is now made to FIGS. 5-7. FIG. 5 is a schematic cross-sectional view of an RF EM radiation absorbing optical connection apparatus 60 constructed and operative in accordance with a first alternative embodiment of the present invention. FIG. 6 is a schematic three-dimensional view of the optical connection apparatus 60 of FIG. 5. FIG. 7 is a schematic view of the optical connection apparatus 60 of FIG. 5 inserted into the optical module 14.

The RF EM radiation absorbing optical connection apparatus 60 includes fiber-attach-latch connectors 62 terminating the optical cable 10. The fiber-attach-latch connectors 62 are substantially the same as the fiber-attach-latch connectors 12 of FIGS. 1 and 2 with the addition of an RF EM radiation absorbing sleeve 64 disposed at least partially over the connector boot(s) 18 and/or at least partially over the rear portion 20 of the connector housing 22.

In some embodiments, as shown in FIG. 5, the RF EM radiation absorbing sleeve 64 is disposed over the connector boots 18, part of the optical cable 10, and over the rear portion 20 of the connector housing 22. The RF EM radiation absorbing sleeve 64 is also disposed over part of the elongated deflectable portions 36 of the latch element 34 and over at least part of the deflectable portion 38 (FIG. 6) of the latch element 34. Additionally, or alternatively, the RF EM radiation absorbing sleeve 64 may be disposed between the optical cable 10 and the connector boots 18.

One advantage of using the RF EM radiation absorbing sleeve 64 is that the RF EM radiation absorbing sleeve 64 may be installed over an off-the-shelf fiber-attach-latch connector thereby transforming a previously non-RF EM absorbing fiber-attach-latch connector into an RF EM absorbing fiber-attach-latch connector. Additionally, the sleeve 64 does not extend to the region (e.g., the front portion 28 of the connector housing 22) where the connector housing 22 inserts into the optical module 14 so that the fiber-attach-latch connector 62 still complies with the module specification of the optical module 14 to ensure interoperability between different vendors.

The RF EM radiation absorbing sleeve 64 may include a flexible region 66, which covers the latch element 34, so as to enable actuation of the latch element 34 via depressing the flexible region 66 of the RF EM radiation absorbing sleeve 64. In some embodiments, the RF EM radiation absorbing sleeve 64 is flexible. In other embodiments, the RF EM radiation absorbing sleeve 64 has limited flexibility. In some embodiments the flexible region 66 may have a gripping surface, e.g., a thumb tab, as shown in FIGS. 6 and 7 to allow gripping and depressing the flexible region 66.

The RF EM radiation absorbing sleeve 64 includes RF EM radiation absorbing material configured to absorb RF EM interference generated by the optical module 14. The RF EM radiation absorbing material may be any suitable RF EM radiation absorbing material, as defined above, according to the amount, and frequency, of RF EMI being generated by the optical module 14.

The RF EM radiation absorbing material forming the RF EM radiation absorbing sleeve 64 may comprise a plastic and/or elastomeric material mixed with an RF EM absorber, such as carbonyl iron, carbon powder, or ARC DD series. In some embodiments the RF EM absorber may comprise more than 50%, and typically 70%, of the RF EM radiation absorbing material mixture, by mass. For example, RF EM radiation absorbing material may include 30-50% of a plastic and/or an elastomeric material mixed with 50-70% of the RF EM absorber, such as carbonyl iron, carbon powder, or ARC DD series, by mass.

The RF EM radiation absorbing sleeve 64 may be formed using any suitable production method. For example, the RF EM radiation absorbing sleeve 64 may be molded from any suitable RF EM radiation absorbing material, as defined above, or may be formed from any suitable RF EM radiation absorbing tape (conforming with the definition of RF EM radiation absorbing material), which is wrapped around at least part of the connector boots 18 and/or at least part of the rear portion 20 of the connector housing 22.

Reference is now made to FIG. 8 is schematic cross-sectional view of an RF EM radiation absorbing optical connection apparatus 68 constructed and operative in accordance with a second alternative embodiment of the present invention. The RF EM radiation absorbing optical connection apparatus 68 includes the optical cable 42 and the fiber-attach-latch connector 44 of FIGS. 3 and 4 with the RF EM radiation absorbing sleeve 64 of FIGS. 5-7 disposed around the connector boots 50 of the fiber-attach-latch connector 44. Therefore, the RF EM radiation absorbing optical connection apparatus 68 includes RF EM radiation absorbing elements of the connector housing 46 (described above in more detail with reference to FIGS. 3-4) and the RF EM radiation absorbing sleeve 64 (described above in more detail with reference to FIGS. 5-7).

The connector housing 46 of the RF EM radiation absorbing optical connection apparatus 68 including the front portion 52, the rear portion 54 and the latch element 48 may be formed from RF EM radiation absorbing material. In some embodiments, the front portion 52, the rear portion 54 and the latch element 48 are formed as a unitary item molded from the RF EM radiation absorbing material. In other embodiments, each section of the front portion 52 (corresponding to sections 30 of FIG. 1) is formed as a unitary item with the associated part of the latch element 48, while the rear portion 54 is formed as another unitary item. In some embodiments, only part of the connector housing 46 is formed from RF EM radiation absorbing material. For example, the front portion 52 and the latch element 48 may be formed from RF EM radiation absorbing material while the rear portion 54 may be formed from a non-RF EM radiation absorbing material such as rubber or plastic.

The RF EM radiation absorbing sleeve 64 of the RF EM radiation absorbing optical connection apparatus 68 may be disposed at least partially over the connector boot(s) 50 and/or at least partially over the rear portion 54 of the connector housing 46. In some embodiments, the RF EM radiation absorbing sleeve 64 is disposed over the connector boots 50, part of the optical cable 42, and over the rear portion 54 of the connector housing 46. The RF EM radiation absorbing sleeve 64 is also disposed over part of the elongated deflectable portions 56 of the latch element 48. Additionally, or alternatively, the RF EM radiation absorbing sleeve 64 may be disposed between the optical cable 42 and the connector boots 50.

The above embodiments are described herein with reference to SFP optical modules operating at 25.78 GHz. The present disclosure may be suitably adapted to provide RF EM radiation absorption for other form factor connectors and/or at different operating frequencies with appropriate changes to the mechanical design of the RF EM radiation absorbing connector housing and/or the RF EM radiation absorbing sleeve.

Various features of the invention which are, for clarity, described in the contexts of separate embodiments may also be provided in combination in a single embodiment. Conversely, various features of the invention which are, for brevity, described in the context of a single embodiment may also be provided separately or in any suitable sub-combination.

The embodiments described above are cited by way of example, and the present invention is not limited by what has been particularly shown and described hereinabove. Rather the scope of the invention includes both combinations and subcombinations of the various features described hereinabove, as well as variations and modifications thereof which would occur to persons skilled in the art upon reading the foregoing description and which are not disclosed in the prior art.

What is claimed is:

1. An optical connection apparatus, comprising:
an optical cable; and
a fiber-attach-latch connector terminating the optical cable, and comprising:
a connector housing including a latch element and a first portion, the first portion of the connector housing being configured to be reversibly inserted into a connector receptable of an optical module having an optical transceiver; and
a connector boot connected to the connector housing and disposed around a part of the optical cable, wherein the first portion of the connector housing which is configured to be reversibly inserted into the connector receptable is formed from radio-frequency (RF) electromagnetic (EM) radiation absorbing material configured to absorb RF EM interference generated by the optical module.

2. The apparatus according to claim 1, wherein the RF EM radiation absorbing material has at least one of: a relative permittivity loss coefficient greater than 0.25; and a relative permeability loss coefficient greater than 0.25 at a frequency of the RF EM interference generated by the optical module.

3. The apparatus according to claim 1, wherein at least 5 mm3 of the connector housing is formed from the RF EM radiation absorbing material.

4. The apparatus according to claim 1, wherein at least 1 mm3 of the connector housing is formed from the RF EM radiation absorbing material.

5. The apparatus according to claim 4, wherein the RF EM radiation absorbing material forming at least 1 mm3 of the connector housing comprises a plastic or elastomeric material mixed with an RF EM absorber.

6. The apparatus according to claim 5, wherein the RF EM absorber is selected from carbonyl iron or carbon powder.

7. The apparatus according to claim 1, wherein the fiber-attach-latch connector includes an RF EM radiation absorbing sleeve disposed at least partially over the connector boot, and including RF EM radiation absorbing material.

8. The apparatus according to claim 7, wherein the RF EM radiation absorbing material of the RF EM radiation absorbing sleeve comprises a plastic or an elastomeric material mixed with an RF EM absorber.

9. The apparatus according to claim 8, wherein the RF EM absorber is selected from carbonyl iron or carbon powder.

10. The apparatus according to claim 7, wherein the RF EM radiation absorbing sleeve is disposed at least partially over the connector boot and at least partially over the connector housing.

11. The apparatus according to claim 10, wherein the RF EM radiation absorbing sleeve includes a flexible region, which covers the latch element, so as to enable actuation of the latch element via depressing the flexible region of the RF EM radiation absorbing sleeve.

12. An optical connection apparatus, comprising:
an optical cable; and
a fiber-attach-latch connector terminating the optical cable, and comprising:
a connector housing including a latch element, the connector housing being configured to be reversibly inserted into a connector receptable of an optical module having an optical transceiver;
a connector boot connected to the connector housing and disposed around a part of the optical cable; and
a radio-frequency (RF) electromagnetic (EM) radiation absorbing sleeve disposed at least partially over the connector boot and the latch element, and including: RF EM radiation absorbing material configured to absorb RF EM interference generated by the optical module; and a flexible region, which covers the latch element, so as to enable actuation of the latch element via depressing the flexible region of the RF EM radiation absorbing sleeve.

13. The apparatus according to claim 12, wherein the RF EM radiation absorbing material has at least one of: a relative permittivity loss coefficient greater than 0.25; and a relative permeability loss coefficient greater than 0.25 at a frequency of the RF EM interference generated by the optical module.

14. The apparatus according to claim 12, wherein the RF EM radiation absorbing material of the RF EM radiation absorbing sleeve comprises a plastic or an elastomeric material mixed with an RF EM absorber.

15. The apparatus according to claim 14, wherein the RF EM absorber is selected from carbonyl iron or carbon powder.

16. The apparatus according to claim 12, wherein the RF EM radiation absorbing sleeve is disposed at least partially over the connector boot and at least partially over the connector housing.

17. The apparatus according to claim 16, wherein at least part of the connector housing is formed from RF EM radiation absorbing material.

18. The apparatus according to claim 16, wherein at least 1mm3 of the connector housing is formed from RF EM radiation absorbing material.

19. The apparatus according to claim 18, wherein the RF EM radiation absorbing material forming at least 1mm3 of the connector housing comprises a plastic or elastomeric material mixed with an RF EM absorber.

20. The apparatus according to claim 19, wherein the RF EM absorber is selected from carbonyl iron or carbon powder.

* * * * *